United States Patent [19]
Phelps, Jr. et al.

[11] Patent Number: 5,661,336
[45] Date of Patent: Aug. 26, 1997

[54] TAPE APPLICATION PLATFORM AND PROCESSES THEREFOR

[76] Inventors: Douglas Wallace Phelps, Jr., 21 Richardson St., Burlington, Vt. 05401; Edward John Dombroski, R.R. 2, Box 407, Jericho, Vt. 05465; William Carroll Ward, 28 Bilodeau Ct., Burlington, Vt. 05401

[21] Appl. No.: 237,025

[22] Filed: May 3, 1994

[51] Int. Cl.$^6$ ................................. H01L 23/495
[52] U.S. Cl. ................ 257/668; 257/677; 257/676
[58] Field of Search .......................... 257/679, 701, 257/668, 677, 676, 666

[56] References Cited

U.S. PATENT DOCUMENTS

| | | | |
|---|---|---|---|
| 3,908,075 | 9/1975 | Jackson et al. | 174/68.5 |
| 4,410,905 | 10/1983 | Grabbe | 357/80 |
| 4,539,472 | 9/1985 | Poetker et al. | 235/488 |
| 4,595,945 | 6/1986 | Graver | 357/70 |
| 4,598,308 | 7/1986 | James et al. | 357/81 |
| 4,603,249 | 7/1986 | Hoppe et al. | 257/679 |
| 4,616,413 | 10/1986 | Iliou et al. | 29/832 |
| 4,754,319 | 6/1988 | Saito et al. | 357/72 |
| 4,796,078 | 1/1989 | Phelps, Jr. et al. | 357/68 |
| 4,862,245 | 8/1989 | Pashby et al. | 357/70 |
| 4,937,203 | 6/1990 | Eichelberger et al. | 437/51 |

(List continued on next page.)

FOREIGN PATENT DOCUMENTS

| | | | |
|---|---|---|---|
| 2-78261 | 3/1990 | Japan | 257/677 |
| 3129870 | 6/1991 | Japan | 257/677 |

OTHER PUBLICATIONS

G. R. Carden, S. Greer, H. Hoffman & D. W. Phelps, "Stabilized Long Wire Bonding Technique" IBM Technical Disclosure Bulletin (1989).

E. J. Dombroski, D. W. Phelps & W. C. Ward, "Thin Small Outline Packages" IBM Technical Disclosure Bulletin, vol. 34 No. 1 (Jun. 1991) pp. 358–359.

P. R. Hoffman, D. W. Phelps & W. C. Ward, "Automated Chip Decal and Lead Frame Lamination Method" IBM Tech. Disclosure Bull, vol. 31, No. 2 Jun. 1988 pp. 405–406.

D. L. Lombra, R. Marks, D. W. Phelps & W. C. Ward "Multiple Chip Heat Sink Package" IBM Tech. Disclosure Bull. Vol. 29 No. 6 (Nov. 1986) pp. 2584–2585.

*Primary Examiner*—Mahshid D. Saadat
*Assistant Examiner*—S. V. Clark
*Attorney, Agent, or Firm*—Theodore R. Touw

[57] ABSTRACT

A platform serves to carry an integrated circuit chip (20) for handling and alignment through wire bonding or TAB operations, provides interconnections, and supports the IC chip in its use environment. The platform base (10) has a flat portion which may have a slot (30) passing through it and extending approximately the length of an IC chip (which has wire-bond pads (140), some of which may be near a chip axis). The IC chip is mounted to the platform base with tape (50), which provides at least one adhesive surface. The tape may be a cast or contained adhesive or epoxy with or without a backing layer, or it may be a thermoplastic or thermo-setting plastic. TAB or wire-bond pads are aligned with respect to the platform slot. If the chip has more than one row of wire-bond pads, the platform may have more than one slot. If more than one chip is mounted to the platform, the platform's base may have one or more slots (30, 40) per chip. Circuitry (90) may be printed on one or both sides of the platform base. The circuitry is preferably made to have a relatively high sheet resistivity to damp ringing of noise signals. Wire bonds are made through the slot (30), connecting pads on the IC chip with printed circuitry. The platform base may have an electrically conductive area (90) on one or both sides to provide a shield, ground plane and/or power bus, connected by wire bonds to pads of the IC chip and to a higher level of circuitry. Conductive bus elements (60 and 70) having continuous wire-bond areas may be provided, attached with tape (80). The platform may have terminals (100) for interconnection with a higher level of circuitry and/or narrow leads (1220) extending over the IC chip. Components (110, 120) other than the integrated circuit chip may also be carried on the tape application platform.

13 Claims, 9 Drawing Sheets

U.S. PATENT DOCUMENTS

| | | | |
|---|---|---|---|
| 4,965,654 | 10/1990 | Karner et al. | 357/70 |
| 4,996,587 | 2/1991 | Hinrichsmeyer et al. | 357/74 |
| 5,070,390 | 12/1991 | Shimizu | 357/70 |
| 5,075,252 | 12/1991 | Schendelman | 437/207 |
| 5,099,309 | 3/1992 | Kryzaniwsky | 357/75 |
| 5,140,404 | 8/1992 | Fogal et al. | 357/70 |
| 5,170,328 | 12/1992 | Kruppa | 257/668 |
| 5,177,032 | 1/1993 | Fogal et al. | 437/220 |
| 5,218,229 | 6/1993 | Farnworth | 257/676 |
| 5,220,195 | 6/1993 | McShane et al. | 257/666 |
| 5,227,232 | 7/1993 | Lim | 257/668 |
| 5,227,338 | 7/1993 | Kryzaniwsky | 437/207 |
| 5,227,662 | 7/1993 | Ohno et al. | 257/676 |
| 5,237,201 | 8/1993 | Tanaki et al. | 257/666 |
| 5,250,839 | 10/1993 | Katoh et al. | 257/666 |
| 5,349,234 | 9/1994 | DesJardin et al. | 257/684 |
| 5,350,947 | 9/1994 | Takekawa et al. | 257/668 |
| 5,382,830 | 1/1995 | Akyürek et al. | 257/701 |
| 5,399,903 | 3/1995 | Rostoker et al. | 257/668 |
| 5,412,247 | 5/1995 | Martin | 257/678 |
| 5,428,247 | 6/1995 | Sohn et al. | 257/676 |

TAPE APPLICATION PLATFORM AND PROCESSES THEREFOR

FIELD OF THE INVENTION

This invention relates to processes for manufacturing integrated circuits, articles useful in manufacturing operations, and articles manufactured using such processes. More particularly, this invention relates to platforms for applying tape to integrated circuits and for carrying integrated circuits of the type utilizing wire bonds or tape automated bonds (TAB) for interconnection with circuitry, methods for using such platforms in manufacturing processes, and integrated circuit assemblies manufactured by such methods.

PROBLEMS SOLVED BY THE INVENTION

A wide variety of methods and structures has been developed for interconnection of integrated circuit (IC) chips with circuitry external to the IC chips, including wire bonding, reflowing bumps of solder material for "flip chip" applications, bonding with tape automated bonding (TAB) devices, etc. The increases in density that have occurred within IC's have made it possible to provide more functions in each IC, such as more logic gates or more memory bits. This increase in function has made it necessary in many cases to provide more interconnections per IC chip. Despite the increase in density, IC chips have also grown in size to accommodate the larger number of individual circuits, gates or bits required for the expanded functions. IC chips have increased in size, not only in length and width, but also in thickness. For those integrated circuit chips which use wire bonding or TAB for their interconnections, these trends have created some problems in manufacturing the products in which IC's are used. For example, wire bond pads positioned along a medial axis of a large IC chip require relatively long wires to reach circuitry or bonding pads off the chip. If the chip surface is above the plane of that circuitry, there is a risk of shorting the wires to an edge of the chip, perhaps by contacting the chip's own substrate, for example. Long bond wires tend to sag, causing further risk of short circuits. Long bond wires are sometimes also moved about during transfer-molding encapsulation operations. For IC chips having bond pads positioned along peripheral areas as well as along a center axis, there are additional problems of potential interference between wires bonded to pads of the various sets of pads. Some integrated circuit designs are affected by high variability in bond wire lengths. Larger and thicker chips require better control of the die-bond "glue line," i.e. the thickness of the layer holding the IC chip die in place.

In high-performance integrated circuits such as high-speed memories, the higher switching frequencies have been accompanied by increased problems due to the inductance of leads, making it important to have interconnections with shorter lead lengths. Noise occurring in high performance integrated circuits is troublesome because the inductance of the interconnections causes ringing. In some environments, electromagnetic interference (EMI) can induce noise if there is improper grounding and/or shielding of signal interconnections from external sources of EMI. Although it is not usually considered EMI, irradiation by alpha particles from the IC chip's environment can also affect IC performance. Alpha-particle barriers are needed to prevent such alpha-particle effects.

In manufacturing processes for bonding IC chips to various packages, there are often mechanical stresses which can cause damage to the IC chips being bonded, resulting in IC chips that are no longer electrically functional after wire bonding. Another troublesome problem is the stress due to thermal expansion coefficient mismatch between the IC chip and the circuitry to which it is connected, e.g. a first-level package. Such thermal-expansion stresses can cause poor reliability of the interconnections, resulting in interconnection failures when the IC chips are heated and cooled during use, due to variations in their power dissipation and/or ambient temperature.

U.S. Pat. Nos. 5,099,309 (1992) and 5,227,338 (1993) by B. R. Kryzaniwsky disclose a three-dimensional memory card structure in which IC chips are positioned inside a card structure prior to lamination of signal and power layers. Thermal conductor planes and power cores in these patents may use copper-Invar-copper conductor material, which can have a thermal expansion coefficient compatible with silicon IC chips, thus alleviating some of the problems mentioned above. U.S. Pat. No. 4,996,587 (1991) by K. Hinrichsmeyer et al. discloses an integrated semiconductor chip package utilizing a carrier having a recess in the bottom surface for an IC chip, and a top-surface slot communicating with the recess. Contact pads in the region of the slot may be connected with conductors on the top side of the carrier, and a number of carriers may be stacked, and interconnected with each other by S-clips. The package of the Hinrichsmeyer et at. patent also alleviates some of the problems mentioned above.

SUMMARY OF THE INVENTION

It is an object of this invention to provide a platform for easy handling and alignment of IC chips during wire bond or TAB operations. Another object of the invention is to provide methods for applying tape or an adhesive layer to the surface of an IC chip with reduced risk of mechanical damage to the IC chip. Another object is to provide electrically insulating tape applied at appropriate interfaces during manufacture of assemblies containing IC chips. Another object of the invention is to provide a process for interconnecting IC chips to other circuitry using a tape application platform. Yet another object of the invention is to provide a platform that can remain with the IC chip in its end-use environment. Yet another object is to provide improved electrical, mechanical and thermal performance throughout the useful life of an IC chip after serving as a tape application platform during manufacturing. Another object of the invention is to provide a platform that can absorb mechanical stresses generated during manufacturing operations and that can absorb stress due to mismatches of thermal expansion coefficients between an IC chip and the circuitry to which it is to be connected. Another object of the invention is to provide a platform that has a thermal expansion coefficient compatible with the expansion coefficient of the IC chip. Another object is accommodation of shorter and more uniform bonding wire run lengths. Another object is to provide for electrical connection of other components in close proximity to the IC chip. A further object of the invention is to provide a power bus, ground bus, and/or electromagnetic shield in close proximity to an IC chip. Other objects include providing barriers to protect IC chips against alpha-particle irradiation. Another object is to provide means of reducing the tinging of noise signals induced in IC chip interconnections and related to their inductance. Another object is to reduce the inductance of interconnections close to the IC chip. Yet another object is to provide a tape application platform of uniformly controlled overall thickness, for consistent assembly in reduced and predictable volume. These and other objects of the invention are achieved with a tape application platform.

We have discovered that a tape application platform can ameliorate many of the abovementioned problems while at the same time making it easier to handle IC's and preventing yield losses during interconnection processes. Particular types of tape application platform embodiments can be aimed at particular problems. Such a tape application platform can finally remain with the IC in its end-use environment. In the end use environment, it can continue to absorb mechanical and thermal stresses, for improved reliability of the products manufactured using the methods described in this specification, while providing improved electrical performance and optionally carrying other components. In particular, it is useful to have discrete components such as resistors and decoupling capacitors mounted on the tape application platform as close as possible to the chip itself.

A platform serves to carry an integrated circuit chip for handling and alignment through wire bonding or TAB operations, provides at least one interconnection, and supports the IC chip in its use environment. The platform has a substantially planar base with at least one slot passing through the base and extending approximately the length of an IC chip (which may have one or more rows of wire-bond pads, some of which may be disposed near a chip axis). Such an integrated circuit chip is mounted to the platform's base with tape, which may provide electrical insulation and preferably provides at least one adhesive surface. There are many suitable materials and forms which we describe collectively as "tape." The tape may be made of Kapton polyimide material Uplex polyimide material, Teflon PTFE material or the like with heat or pressure activated adhesive or epoxy adhesive. It may be a cast or contained adhesive or epoxy with or without a backing layer, or it may be a thermoplastic or thermo-setting plastic preform. The row of wire-bond pads or IC chip axis is aligned with the platform slot. If the chip has more than one row of wire-bond pads, the platform may have more than one slot (one slot for each row of pads). If more than one chip is mounted to the platform, the platform's base has one or more slots for each chip as appropriate. Circuitry may be printed on one or both major surfaces of the platform, e.g. on the side of the platform opposite the side to which the chip is mounted with tape. For some high speed applications, the circuitry is preferably made to have a relatively high sheet resistivity, to incorporate resistance which can damp the ringing that noise signals have due to the inductance of the interconnection circuitry. For other applications, the circuitry is preferably made with lower resistivity metals such as copper or alloys containing copper and tungsten, iron, or nickel. Wire bonds are made between pads on the IC chip and the printed circuitry. Thus each bonding wire passes through a slot.

The platform may have an electrically conductive surface area on one or both sides to provide a shield or ground plane and/or a power bus for the integrated circuit. One or more wire bonds may connect appropriate pads of the integrated circuit chip to such conductive areas. The platform may have terminals for interconnection with a higher-level of circuitry, such as a printed circuit card or board. In a preferred embodiment these are edge-connector terminals. Components other than the integrated circuit chip may also be carded on the tape application platform.

For many embodiments, the platform base is preferably made from a sheet of epoxy-glass printed wiring board laminate. The conductive layers (either printed circuitry or continuous conductive layers) are preferably made of a laminated composite layer with the above-mentioned increased resistivity, and a thermal expansion coefficient that is compatible with the expansion of the IC chip material. Alternative embodiments preferred in other applications include a metallized ceramic glass/metal or metallized plastic base. All of the embodiments, while substantially planar, may incorporate a recess surrounding the slot. When included, the recess is wide enough to accommodate the IC chip, and preferably not of such a depth as to position the chip bottom surface to be coplanar with the platform bottom surface. Embodiments with recessed chips have advantages in that the overall thickness of the assembly is small, and the IC chip is better protected from mechanical damage.

In a simplified embodiment of the platform, there is no circuitry other than a ground and/or power conductor, and in that embodiment the platform may be stamped from a sheet of metal such as a copper-containing alloy, or preferably from a clad or laminated composite metal of appropriate thermal expansion, e.g. Cu-Invar-Cu, Cu-W alloy, Mo, Mo clad with Cu, etc. For efficient manufacturing, platforms are made in a continuous strip having side rails with sprocket holes. After assembly and bonding, the IC chip, its bonds, and a surrounding portion of the tape application platform may be encapsulated with epoxy or the like. If appropriate, a portion of the next higher level of circuitry surrounding the platform and IC chip may be included in the encapsulation. When the platform base has a recess surrounding its slot or slots, the encapsulation can cover the entire recess and surrounding base on one side and the bonds, slot, and surrounding base on the other side. Thus a recessed base also has advantages in encapsulation.

A manufacturing process using the platform includes preparation of a substantially planar platform base having a slot (optionally within a recess), preparation of a tape suitable for adhesion to the platform base, lamination of the tape to the base, alignment of an IC chip to the slot (within a recess if required), lamination of the IC chip to the tape (curing or cutting the tape if required), alignment of the platform to wire-bond or TAB equipment, and bonding of interconnections to the IC chip by conventional wire-bond or TAB methods. Encapsulation of the IC chip and the surrounding portion of the tape application platform completes the process.

These and other objects, advantages, and features of this invention will be clear from the description following below of the preferred embodiments of the invention, as illustrated in the accompanying drawings.

DEFINITIONS

The following terms are used in this specification with the meanings shown:

Contained adhesive: A predetermined amount of adhesive material deposited onto a substrate in a predetermined pattern (e.g. a lozenge shape or an array of dots), by conventional deposition methods (e.g. silk screening, printing, stamp transfer, or the like)

IC: Integrated circuit

Invar: A known alloy containing about 64% iron and 36% nickel, which may contain about 0.2% carbon E-glass: Conventional glass-epoxy printed circuit material, which may have multiple layers and printed circuitry of copper or the like This material is listed, for example, in the "Electronic Materials Handbook" (TM), Volume 1 Packaging (1989) ISBN 0-87170-285-1, published by ASM International, Materials Park, Ohio 44073.

FR-4: A particular conventional tetra-functional epoxy laminate material, also listed in the same reference PTFE: Polytetrafluoroethylene TAB: Tape automated bonding tape: In addition to its conventional meaning, including thin flexible substrates coated on one or both sides with adhesives, this term is intended here to include layers of thermoplastic or thermo-setting plastic, cast or contained adhesive or epoxy, or performs of adhesive material cured or activated by pressure, heat, radiation or other means.

DETAILED DESCRIPTION OF THE PREFERRED EMBODIMENTS

Figure 1:
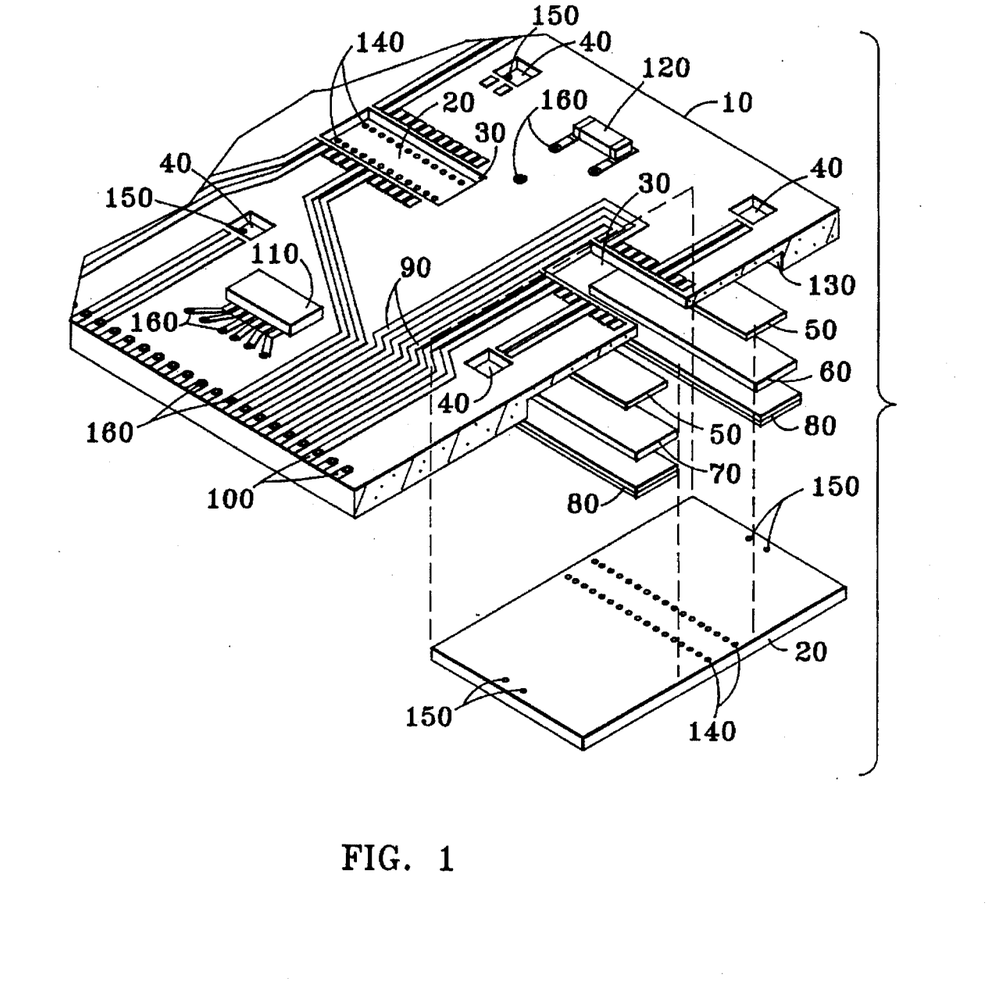
FIG. 1 shows a perspective exploded view (partly cutaway) of a first preferred embodiment of the tape application platform in accordance with the present invention.

The various preferred embodiments of the tape application platform described in this specification range from some very simple embodiments to some that are fairly complex and incorporate all or nearly all of the valuable features in one embodiment. The preferred embodiment illustrated in FIG. 1 is one of the more complex embodiments of the invention and illustrates many of the features and advantages. FIG. 1 shows an exploded, partially cutaway perspective view era first preferred embodiment of the tape application platform. The exploded view in FIG. 1 shows schematically the various elements as if they were about to be assembled together. An actual process for assembling the tape application platform might be accomplished without having the various elements disposed as in FIG. 1, but instead having some elements first assembled in subassemblies, and then having such subassemblies brought together.

As shown in FIG. 1, the tape application platform has a base 10, which may be entirely planar on both of its major surfaces or may have a recess 130 on one or both of its major surfaces. In FIG. 1, optional recess 130 is shown in its preferred location on the side of base 10 where IC chip 20 is to be mounted. Base 10, in preferred embodiments, has at least one planar major surface, which in the embodiment of FIG. 1 is shown as the top surface.

IC chip 20 has bonding pads 140 (shown in the embodiment of FIG. 1 as arranged mostly in rows, although a row arrangement of bonding pads 140 is not necessary to the invention). A slot 30 extends through base 10, from one major surface to the other, allowing access to bonding pads 140 during assembly of the tape application platform. Optionally, additional slots 40 extend through base 10 to allow access to other additional bonding pads 150. There is no significant difference between bonding pads 140 and bonding pads 150 in this context; they are identified separately only to more clearly point out the reason for optionally providing additional slots 40. Preferably, slot 30 is substantially co-extensive with one dimension of IC chip 20, i.e. it is about as long as the chip. Slot 30 is preferably at least as long as any row of bonding pads 140 with which it is aligned. Because FIG. 1 is partially cut away, the end of slot 30 nearer to the reader is not visible. In the preferred embodiment shown in FIG. 1, tape strips 50 are applied to base 10 on either side of slot 30. Conductive metal bus elements 60 and 70 are applied to tape strips 50. Conductive metal bus elements 60 and 70 may be copper or copper alloys clad, laminated or plated with other metals, such as noble metals. Bus element 60 may be provided for connection to one voltage of the IC power supply, for example, and bus element 70 provided for connection to a different voltage. Or, alternatively, one of bus elements 60 or 70 may be provided for connection to an electrical ground. Additional tape strips 80 are applied to the remaining major surface of bus elements 60 and 70. Wire bonds (not shown) may be made between selected pads 140 or 150 and bus elements 60 or 70 as described below with reference to FIGS. 10A and 10B. IC chip 20 is aligned with slot 30 and optional slots 40, and applied to both tape strips 80. Preferably, in aligning IC chip 20 with slot 30, bonding pads 140 are aligned with the centerline of slot 30. While FIG. 1 shows tape 50 as single-layer tape and tape 80 as double-layer tape, various other arrangements may be chosen for particular applications. For example, tape 50 may be a thin layer of thermoplastic or cast adhesive and tape 80 a single-sided adhesive tape.

Base 10 may carry on one or both of its major surfaces a conductive surface, which may be a conventional conductive layer laminated onto base 10 and patterned as printed circuitry 90, as shown in the embodiment of FIG. 1. In FIG. 1, printed circuitry 90 terminates in edge-connector contacts 100 at an edge of base 10. Wire bonds (not shown) may be made to connect selected pads 140 and/or 150 to printed circuitry 90. Through-holes 160 may be provided to connect circuitry on one side of base 10 to circuitry on the other side, and may be plated-through-holes. Printed circuitry 90 and/or edge-connector contacts 100 may be laminated, clad or plated with metals such as noble metals. In some simpler applications, printed circuitry 90 may be replaced by a continuous conductive layer that is not patterned as printed circuitry, or that is minimally patterned by merely being separated by a gap into two electrically disjoint areas (for example, for providing a power supply voltage bus and a ground bus on one or both major surfaces of base 10). Where the bus functions are provided by conductors on base 10, optionally with plated-through-holes in base 10, it may be possible to eliminate bus elements 60 and/or 70 and also eliminate one of tape layers 50 or 80, attaching IC chip 20 with one tape, e.g. 80.

Base 10 may also be adapted for carrying other components in addition to IC chip 20. These additional components may include discrete components such as resistors and decoupling capacitors, or may be surface-mount devices 110 and 120 as shown in FIG. 1. Printed circuitry (not shown in FIG. 1) on one or both major surfaces of base 10 may be provided to interconnect additional components such as devices 110 and 120 with IC chip 20.

The preferred embodiment shown in FIG. 1 is especially useful for memory IC chips 20, such as 16 Mbit memory chips having bonding pads 140 and 150 aligned along one or more rows as shown in FIG. 1. Materials preferable for use in base 10 include E-glass/epoxy laminate, FR-4 Tetrafunctional epoxy laminate, E-glass/BT-blend laminate, E-glass/polyimide laminate, and e-PTFE/epoxy laminate (the latter available from W. L. Gore & Associates). For compatible thermal expansion, polyimide materials such as Kevlar may be used in base 10. Conventional methods of laminating these materials with conductive layers, drilling, plating, and patterning printed circuitry on the card material are used to make base 10. A recess 130, if required, may be provided by pre-punching a layer of the card material before lamination. Slots 30 and/or 40 may be made by conventional methods.

For applications in more severe environments, other materials such as alumina ceramics might be selected for the material of base 10. If base 10 requires a recess 130 surrounding slots 30 and/or 40, it may be made by laminating two or more layers of green sheet punched with different size slots: one size for slot 30, for example, and a larger size for recess 130 to surround it, and then co-firing the laminated stack. Various glasses or glass ceramics may also be used as materials for base 10. Other choices of materials for base 10 in various other embodiments of the tape application platform are described below.

In many preferred embodiments of the tape application platform, the conductive layer in which printed circuitry 90 may be patterned on one or both major surfaces of base 10 (and in some applications also bus elements 60 and 70) is a conductive material with relatively high resistivity. Particularly for high-speed memory applications, a high resistivity conductive material can reduce ringing occurring when noise is induced in the circuits, and the circuits include the inductance of the interconnections. The conductive layers each have thicknesses preferably between 0.003 millimeters and 0.3 millimeters, and even more preferably between 0.015 millimeters and 0.065 millimeters. In terms of conventional printed circuit conductor specifications, the preferred range is 1/10 oz. to 10 oz., but even more preferred between ½ oz. and 2 oz. With these preferred thicknesses, the preferred range of conductor resistivity for the high-speed applications mentioned is greater than 10 ohm-centimeters, and even more preferred, greater than 75 ohm-centimeters. In terms of sheet resistivity of the conductive layers, the preferred range is between 10,000 ohms per square and 100,000 ohms per square, and even more preferably between 15,000 ohms per square and 50,000 ohms per square. Of course, for lower speed circuits and many other applications it is preferable to minimize the resistivity of the conductive layer from which printed circuitry 90 is patterned.

In addition to its resistivity, an important property of the conductive material used in the tape application platform is its thermal expansion coefficient, which preferably is compatible with the thermal expansion of IC chip 20. The dominant materials with respect to thermal expansion in various IC chips are semiconductors such as silicon, germanium and gallium arsenide. Preferred embodiments of the tape application platform use conductive layers having thermal expansion coefficients that match the coefficients of these semiconductor materials. Even more preferred are conductive layers whose expansion coefficients are intermediate between the IC chip semiconductor expansion coefficient and the coefficient of the next level of circuitry, so as to help accommodate differential expansion. A preferred conductive material meeting these objectives is a composite film having layers of different metals combined in suitable proportions to achieve the desired thermal expansion. For some applications, a two-metal composite may be used, provided precautions are taken to allow for bending due to differential expansion between the two sides of such a composite. A preferred conductive material is a clad or laminated composite with three layers having the same metal on the two outer layers. An especially preferred composite has three layers, of copper, Invar alloy and copper respectively. Even more preferred is a clad or laminated composite in which copper, Invar and copper are laminated Coy cladding) in percentages of 1% to 25% copper, 50% to 98% Invar, and 1% to 25% copper respectively. Most preferred is a dad laminate consisting of 5% to 12.5% copper, 75% to 90% Invar, and 5% to 12.5% copper respectively. Other materials that can be used include sintered copper-tungsten, for example, which can be made with a compatible thermal expansion. The preferred materials for thermal expansion can also provide the preferred ranges of resistivity described previously above. The same considerations as to thermal expansion can be extended to bus elements 60 and 70 of FIG. 1, which may also be made of the preferred clad or laminated composite metals.

Suitable encapsulant materials include many conventional encapsulants such as one- or two-part epoxy resins, acrylic conformal coatings, pellet encapsulants and the like. Low-stress encapsulants with high glass transition and low thermal expansion are preferred.

FIG. 1 also shows additional slots 30 and 40 for additional IC chips 20 on the same tape application platform, although only one IC chip 20 is explicitly illustrated in FIG. 1. In principle, any number of IC chips 20 can be mounted on the same tape application platform. For memory chips, the preferred number of chips per platform is determined by the memory organization and the bit organization of the memory IC chips.

Figure 2:
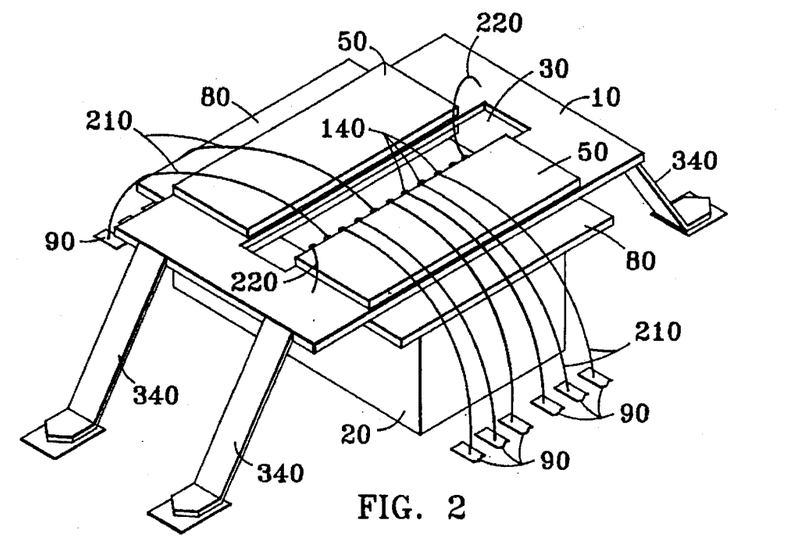
FIG. 2 shows a perspective view of a second embodiment of the tape application platform.
Figure 3:
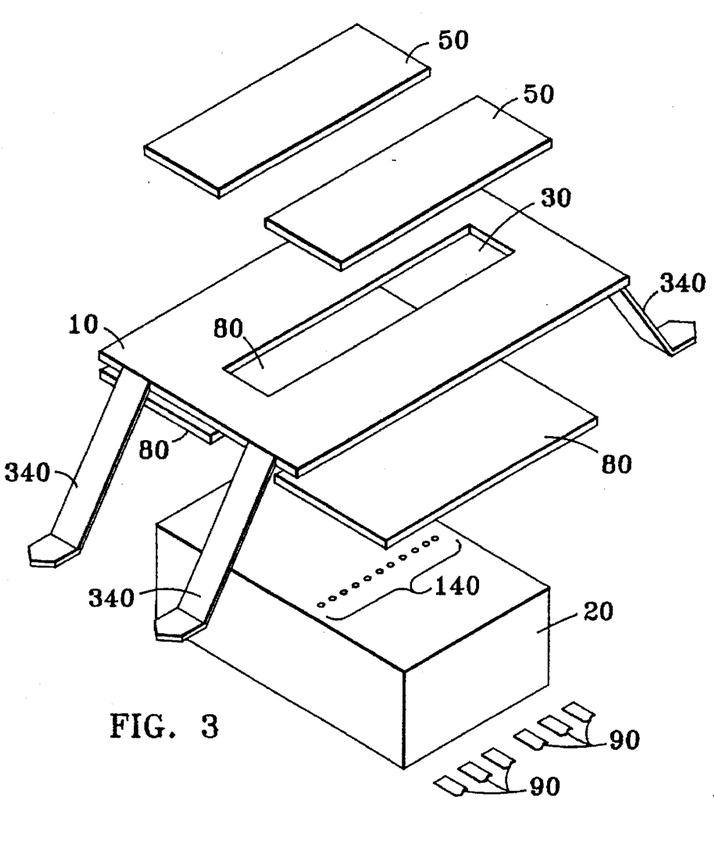
FIG. 3 shows an exploded perspective view of the second embodiment shown in FIG. 2.

FIG. 2 shows a perspective view of an especially simple second embodiment of the tape application platform. This embodiment may have a base 10 made entirely of metal conductor such as copper, silver, stainless steel, molybdenum, copper-tungsten, Invar, or other alloys, which may be laminated, clad, or plated with other metals, such as noble metals. Base 10 of this embodiment is preferably made of the preferred composite conductor materials described above. In this embodiment, base 10 has no printed circuitry; both of its major surfaces are conductive over their entire area. FIG. 3 shows an exploded perspective view of the same second embodiment shown in FIG. 2. Referring to both FIG. 2 and FIG. 3 helps to clarify the following description of this embodiment.

In the embodiment of FIGS. 2 and 3, base 10 has a single slot 30, which is aligned with bonding pads 140 of IC chip 20. Base 10 has optional extensions 340 which are bent out of the major plane of base 10 as shown in the figures. Of course only the major portion of base 10 remains planar after extensions 340 are bent out of plane. Extensions 340 may be used to provide connection of base 10 to a ground bus (not shown) on the next level of circuitry. Extensions 340 can also support IC chip 20 and the other parts of the assembly shown in FIG. 2. Tape pieces 80 may be double-sided adhesive tapes, which adhere both to base 10 and to IC chip 20. Tape pieces 50 may be single-sided adhesive tapes which adhere to base 10 and serve to prevent bond wires 210 and 220 from contacting the conductive surface of base 10. Bond wires 210 connect bonding pads 140 to printed circuitry lands 90, passing through slot 30. Optional bond wires 220 connect particular bonding pads 140 to base 10 and also pass through slot 30.

Figure 4:
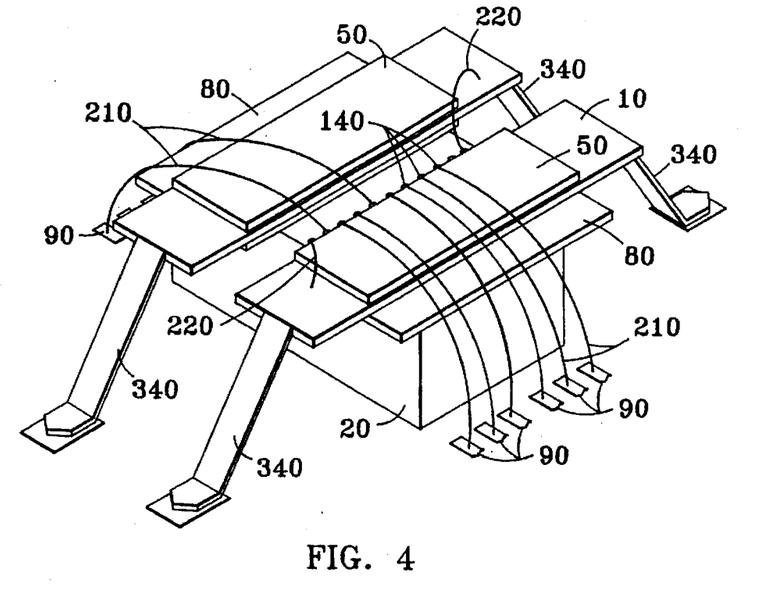
FIG. 4 shows a perspective view of a third preferred embodiment.

FIG. 4 shows a perspective view of a third preferred embodiment. This embodiment is similar to the embodiment shown in FIG. 2. It differs from FIG. 2 only in that, after assembly, alignment, placement, bonding, and an excision operation, base 10 of the tape application platform of FIG. 4 has been left divided into two disjoint parts. This embodiment has an advantage of allowing the two disjoint conductive base 10 parts remaining to be used for two different voltage buses for IC chip 20. These two buses may be a supply voltage bus and a ground bus, or two different polarity supply voltages, for example. Except for the division of base 10 by virtue of an excision operation, the other elements shown in FIG. 4 have the same relationships and functions as the correspondingly numbered elements of FIG. 2. The similarities and differences of the embodiments of FIGS. 2 and 4 are explained further by the description below referring to FIGS. 6 and 7.

Figure 5:
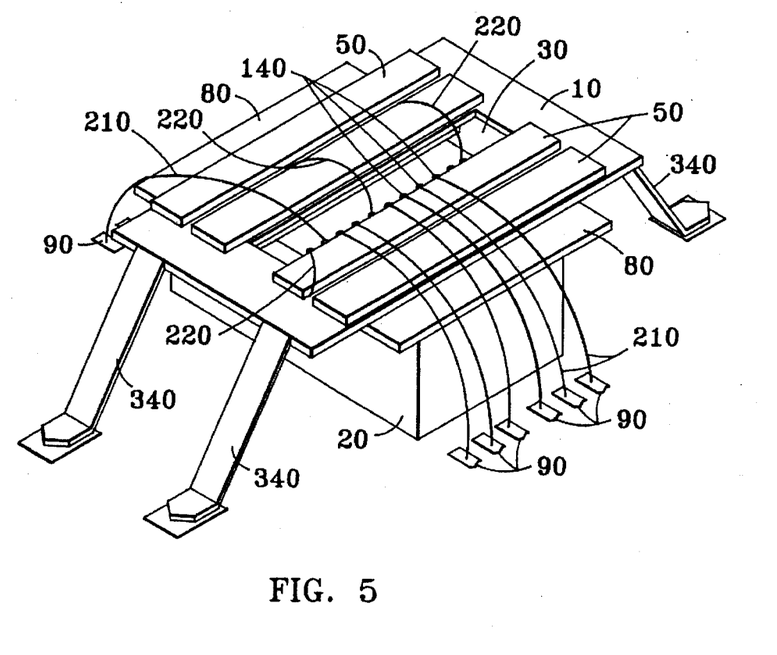
FIG. 5 shows a perspective view era fourth preferred embodiment.

FIG. 5 shows a perspective view of a fourth preferred embodiment of the invention. This is similar to the second preferred embodiment shown in FIG. 2, but differs from that second embodiment in the number and arrangement of tape pieces 50 and in the disposition of bond wires 220. In FIG. 5 there are two parallel tape pieces 50 on each side of slot 30. The space between adjacent tape pieces 50 on each side is provided to allow multiple short bond wires 220 to contact a conductive surface of base 10. These multiple bond wires 220 connect particular pads 140 to a conductive surface of base 10, with short wire lengths and having support and insulation provided by tape pieces 50. Other (longer) bond wires 210 pass over both tape pieces 50 on each side to connect particular bond pads 140 to printed circuitry lands 90. Another embodiment (not shown) would combine the number and arrangement of tape pieces 50 as in FIG. 5, with the divided base 10 arrangement of FIG. 4. The two disjoint bus elements as in FIG. 4 may then be separately contacted by relatively short bond wires 220 from particular bonding pads 140, passing over only one of the two tape pieces 50 on each side.

Figure 6:
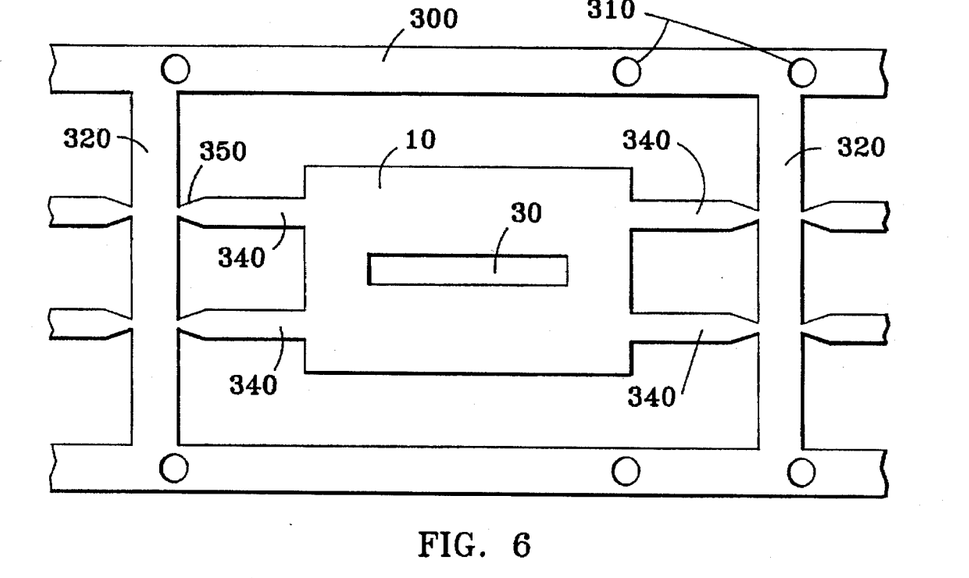
FIG. 6 shows a plan view of a segment of a base used in the second preferred embodiment of the invention.

FIG. 6 shows a plan view of a segment of a continuous strip base used in the second preferred embodiment of the invention. The structure shown in FIG. 6 is a uniformly thin flat strip. FIG. 6 shows one segment and small portions of adjacent segments of a large number of identical segments in a continuous strip. The strip is used with conventional lead-frame handling equipment and methods. As shown in FIG. 6, the strip has side rails 300 having sprocket holes 310 spaced continuously along its entire length. Each segment has at least one bar 320 extending between side rails 300. Attached to bar 320 are one or more extension portions 340 supporting planar portion of base 10 having a slot 30 (corresponding to base 10 and slot 30 of FIG. 2). Extension portions 340 may have narrowed portions 350 for ease of separating portions 10 and 340 from the remainder of the strip in an excision operation. The entire continuous strip of FIG. 6 is made of uniformly thin material suitable for base 10, preferably a preferred laminated composite metal material with preferred resistivity and thermal expansion coefficient as described above. The strip is otherwise made by conventional methods such as those used to fabricate lead-frame material for IC chips. In use, tape strips 50 and/or 80 are applied to one or both sides of the strip of FIG. 6, and an IC chip 20 is aligned (with bond pads aligned to slot 30) and placed against a tape piece 50 or 80 at each segment of the strip. After alignment of each IC chip 20 to its desired bonding location, wire bonds 210 and optionally wire bonds 220 are bonded, and the segment excised. (Any required bending, as of extensions 340, or physical offsets are made as needed at an appropriate stage of the process.)

Figure 7:
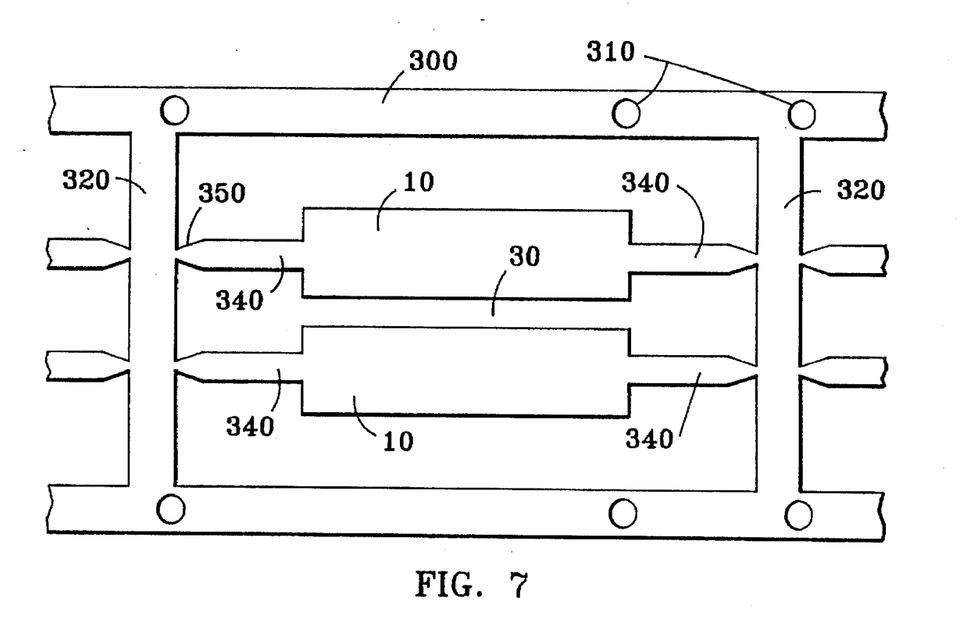
FIG. 7 shows a plan view of a segment of a base used in the third preferred embodiment of the invention.

FIG. 7 shows a plan view of a segment of a continuous strip base used in the third preferred embodiment of the invention, similar to FIG. 6. The embodiment of the continuous strip shown in FIG. 7 corresponds to the third embodiment of FIG. 4. The description of FIG. 6 applies equally to FIG. 7, with corresponding elements having the same relationships and functions. It is only at the time of excision that base 10 of FIG. 7 becomes divided into two disjoint parts, because of the fact that slot 30 in FIG. 7 extends from one bar 320 to the next bar 320 of the adjacent segment.

It will be seen that the relatively simpler embodiments of FIGS. 2 or 4 (optionally made using the continuous strip approach of FIG. 6 or 7) may be used in a dual application of the invention to assemble subassemblies for the embodiment of FIG. 1. Thus the bus elements 60 and 70 of FIG. 1 may be provided by the base parts 10 of FIG. 4, for example. In such a dual application of the invention, minor variations may be made, such as bending extensions 340 of FIG. 4 in the opposite direction from that shown in FIG. 4 in order to attach them to base 10 of FIG. 1.

Figure 8:
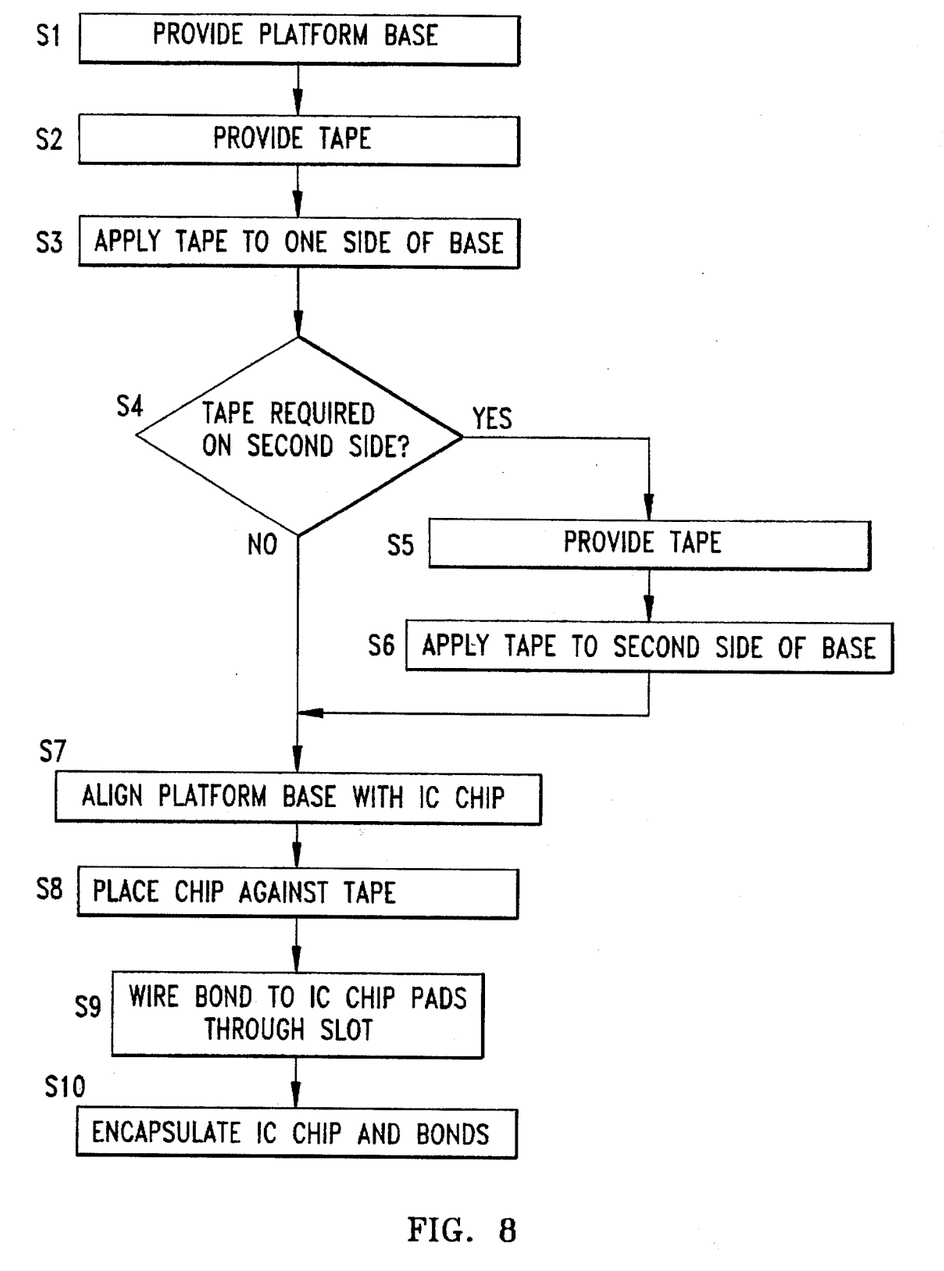
FIG. 8 is a flow chart showing the steps of a manufacturing process in accordance with the present invention.

FIG. 8 is a flow chart showing the steps of a manufacturing process in accordance with the present invention, illustrating how the tape application platform is used. In FIG. 8, in step S1, a base 10 is provided, having a slot 30 and either printed circuitry 90, or a conductive surface, or narrow leads. In step S2, tape 50 or 80 is dispensed, punched, or cut from a continuous strip, or provided in a preform, and in step S3, applied to one side of the base. Punching out a segment of tape (S2) may occur simultaneously with application (S3 and S6). If tape is required on the second side of the base (decision step S4), then additional tape 50 or 80 is provided (step S5), and applied (step S6). The tapes used in steps S5 and S6 may be of different types than the tapes used in steps S2 and S3. For example, tape for step S6 may have adhesive on both sides, while tape for step S3 may have adhesive on only one side, or vice versa. Or any of the tapes may be cast adhesive, or contained adhesive or epoxy, or thermoplastic layers or thermo-setting plastic preforms.

In step S7 of FIG. 8, base 10 is aligned with an IC chip 20. Specifically, one or more slots 30 and/or 40 in base 10 are aligned with bonding pads 140 and/or 150 on IC chip 20. When aligned, IC chip 20 is placed (step S8) against a selected one of the tapes applied in steps S3 or S6. If any of the tapes require curing, the curing is preferably done as a supplementary process step (not shown in FIG. 8) between steps S8 and S9. In step S9, wire-bond (or TAB, etc.) connections 210 and/or 220 are made through the slot. Wire bonds 210 and/or 220 connect bonding pads 140 and/or 150 on IC chip 20 with either printed circuitry 90 or conductive surface areas on the base 10 provided in step S1, or otherwise to printed circuit lands at the next higher level of circuitry (e.g. a circuit board). The process of FIG. 8 is completed in step S10, in which the IC chip 20 and the bonds 210 and/or 220 made in step S9 are encapsulated. This may be done by various conventional methods of dispensing and curing suitable encapsulant, including methods of placing and curing epoxy preforms, or conventional transfer molding. Preferably, the encapsulation material is made to cover both sides of the entire chip 20, all of its bonds 210 and 220, the surrounding portions of the base 10, and (if appropriate) the surrounding portions of the next higher-level of circuitry, to protect the IC chip 20 and its bonds 210 and 220 from deleterious environmental effects.

Figure 9A:
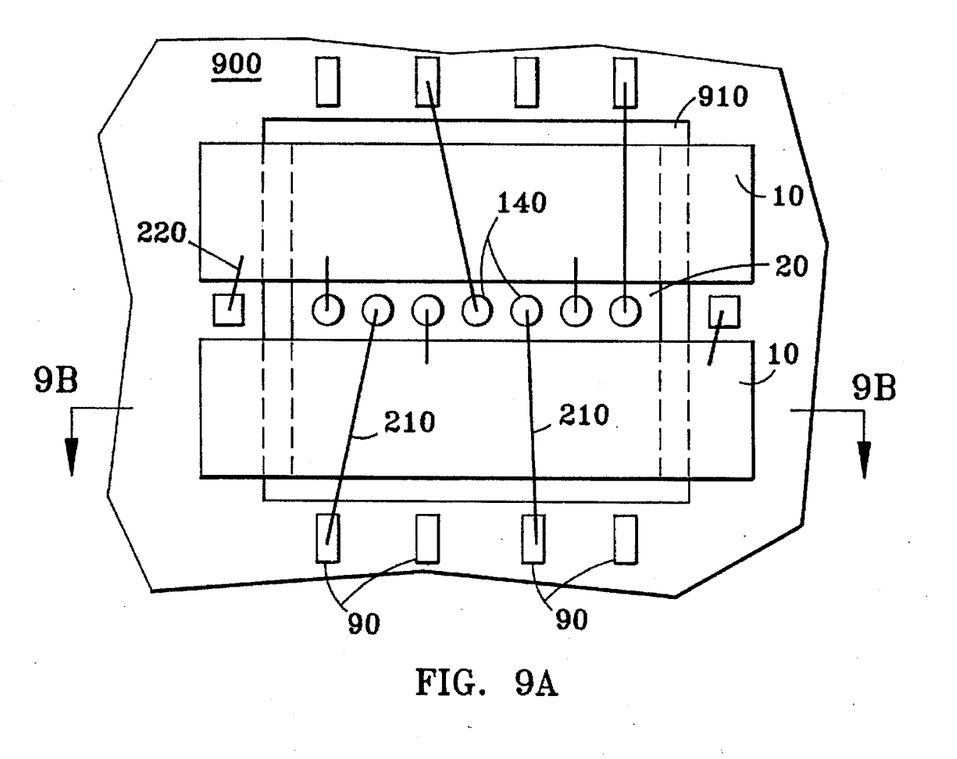
FIG. 9A shows a top view illustrating a tape application platform embodiment in use.
Figure 9B:
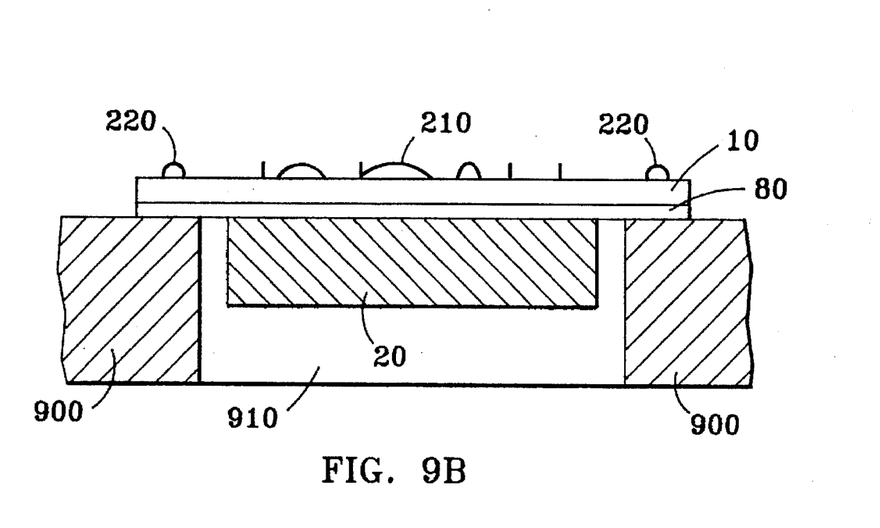
FIG. 9B shows a cross-section view illustrating a tape application platform embodiment ill use.

FIGS. 9A and 9B illustrate use of an embodiment of the tape application platform. FIG. 9A is a top view; FIG. 9B is a side view cross-section taken at section B—B. In both FIG. 9A and FIG. 9B, a circuit card 900 has a cavity 910, which may extend through the thickness of card 900. Cavity 910 may alternatively extend partly into card 900 to form a recess. Flat tape application platform bases 10 extend beyond the edges of cavity 910. On FIGS. 9A and 9B, bases 10 may have been separated from each other by excision from a tape application platform base segment of the type shown in FIG. 7, but not necessarily requiring extensions 340.) Tape pieces 80 (which in this application are double-sided tape) may also extend beyond the edges of cavity 910. IC chip 20 would be supported in cavity 910 by the tape application platform during bonding of bond wires 210 and 220, and IC chip 20 remains supported by the tape application platform after wire bonding. Encapsulation of IC chip 20, the tape application platform, and surrounding portion of card 900 is not shown in FIGS. 9A and 9B.

Figure 10A:
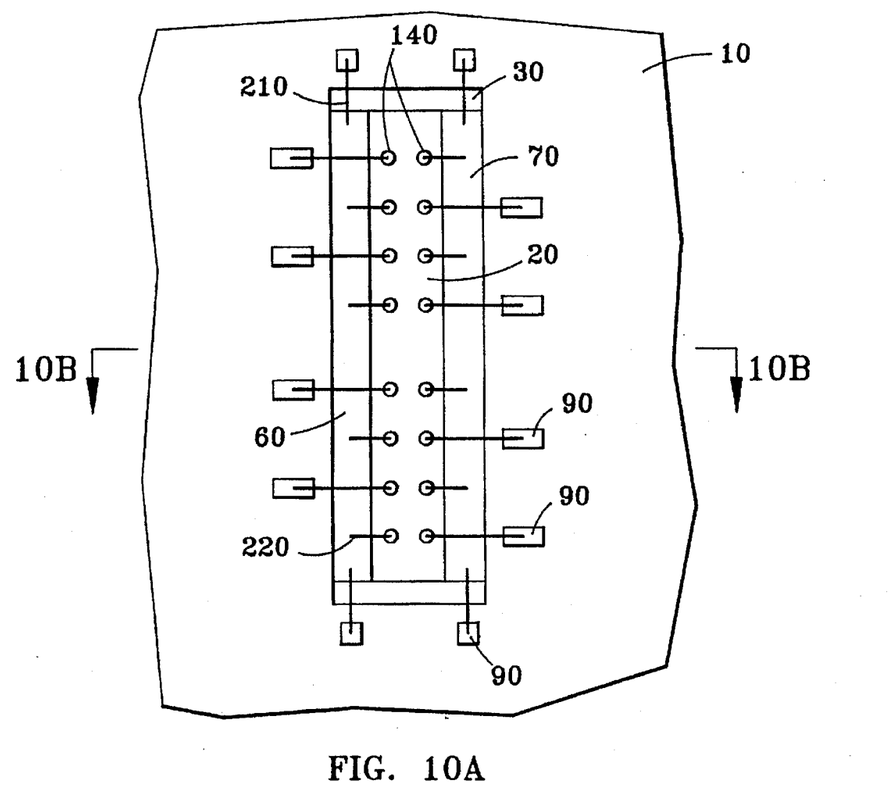
FIGS. 10A and 10B respectively show a top view and cross-section view illustrating a fifth embodiment of the tape application platform.
Figure 10B:
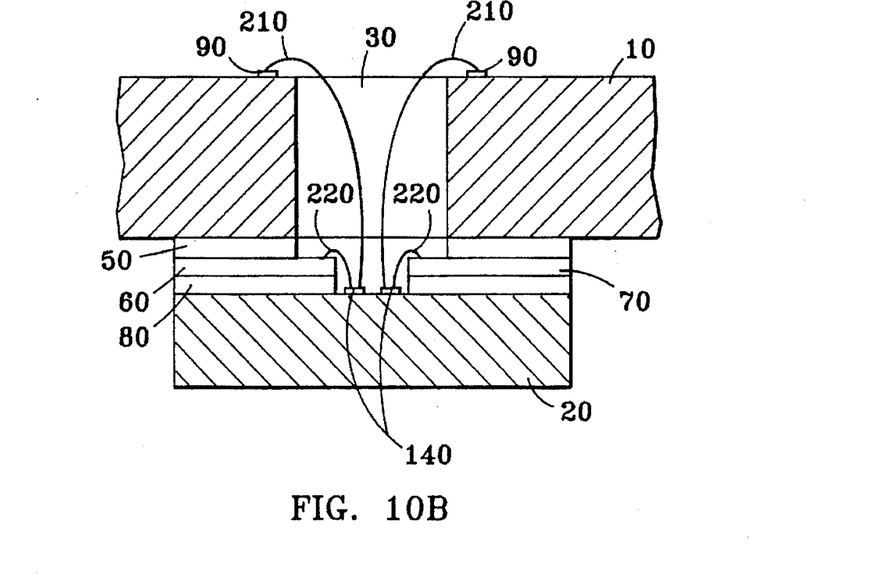

FIGS. 10A and 10B shows a fifth embodiment of the tape application platform, in which bus elements 60 and 70 have double sided tape pieces 50 and 80 on both of their major surfaces, and these hold IC chip 20 under a slot 30 in a platform base 10 which may be a circuit card. In this embodiment, elements 60 and 70 are either made of a conductor or have a conductive layer on at least their top surfaces. The tape application platform of FIGS. 10A and 10B serves as an electrical shield or as power and/or ground buses for IC chip 20. In the embodiment shown in FIGS. 10A and 10B, bus elements 60 and 70 would preferably consist of gold-plated nickel, or a ceramic or plastic base metallized with metal layer(s) including a final conductive layer bondable with conventional wire-bonding techniques. It will be apparent to those skilled in the art that bus elements 60 and 70 in FIGS. 10A and 10B may be either separate electrically disjoint elements, as for ground and a supply voltage, or may both have a common electrical connection, e.g. to a ground. As mentioned with reference to FIG. 1, a conductive area on a surface of base 10 may be used with plated through-holes in base 10 in some applications to provide the function of voltage and/or ground buses, allowing elimination of bus elements 60 and/or 70.

Figure 11A:
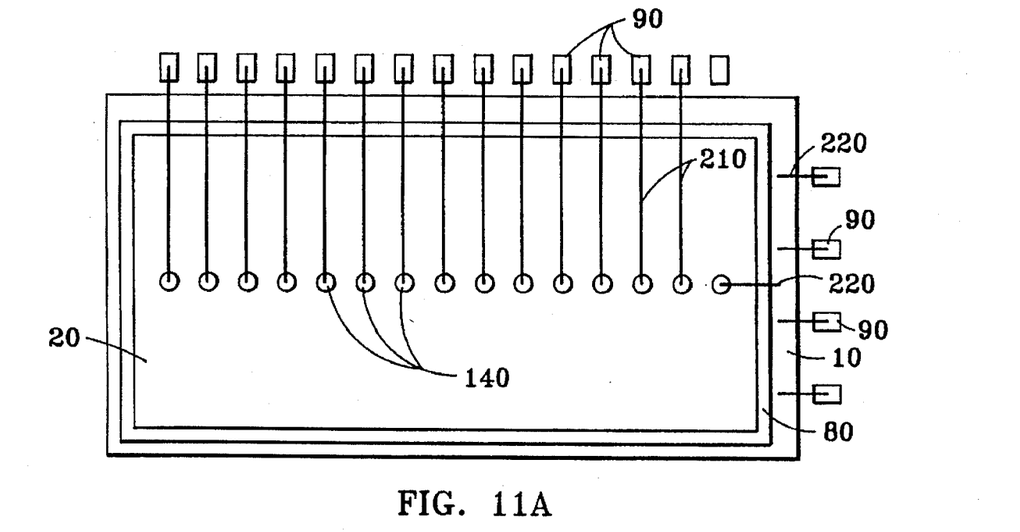
FIGS. 11A and 11B respectively show a top view and an elevation view illustrating a sixth embodiment of the tape application platform.
Figure 11B:
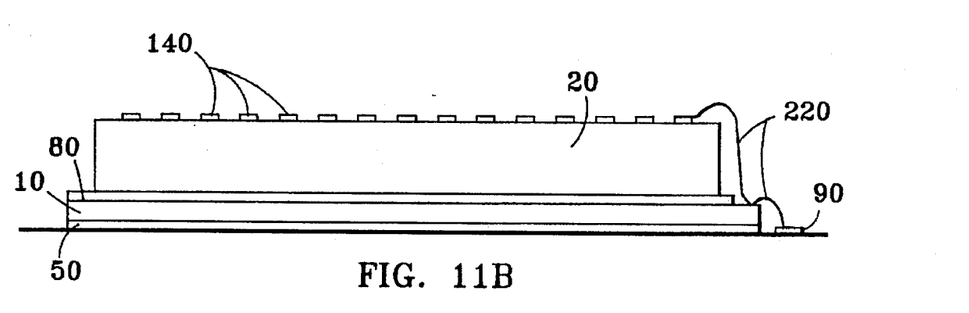
Figure 11C:
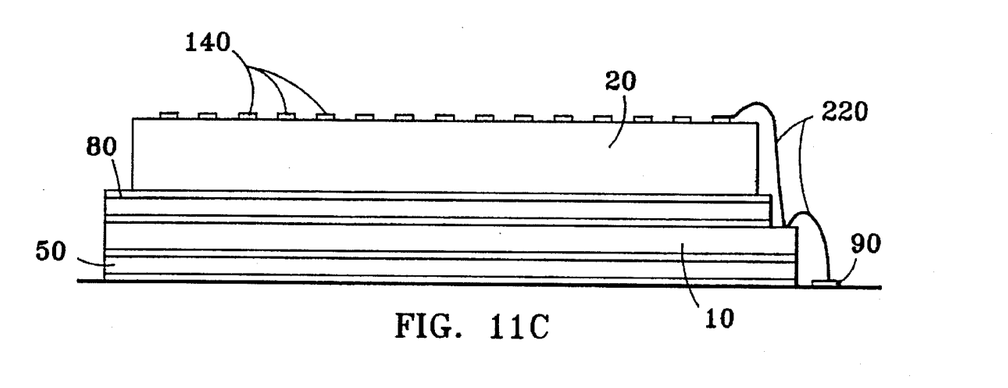
FIG. 11C shows an elevation view illustrating a detail of the sixth embodiment.

FIGS. 11A and 11B respectively show top and elevation views era sixth embodiment of the invention in use. In FIGS. 11A and 11B, the tape application platform acts as an electrical shield, extending under the entire length and width of an IC chip device 20, maintains a uniform controlled "glue line" (i.e. the thickness of the platform base 10 and tapes 50 and 80), and provides a thermal expansion coefficient compatible with IC chip 20 and with the substrate to which tape 50 is adherent. In this embodiment, tapes 50 and 80 may be adhesive layers such as epoxy, and base 10 may be a solid conductor such as the dad composite metal material described above, or may be metallized plastic or ceramic. FIG. 11C illustrates an alternative detail for the embodiment shown in FIG. 11B, in which tapes 50 and 80 of FIG. 11B are both replaced with double-sided adhesive tapes 50 and 80.

Figure 12A:
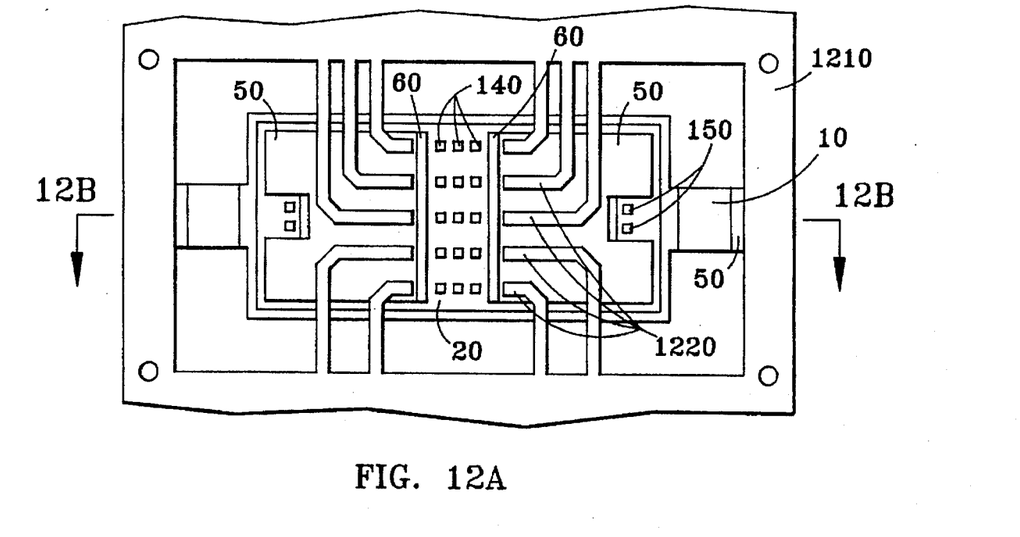
FIGS. 12A and 12B respectively show a top view and an exploded cross-section view illustrating a seventh embodiment of the tape application platform.
Figure 12B:
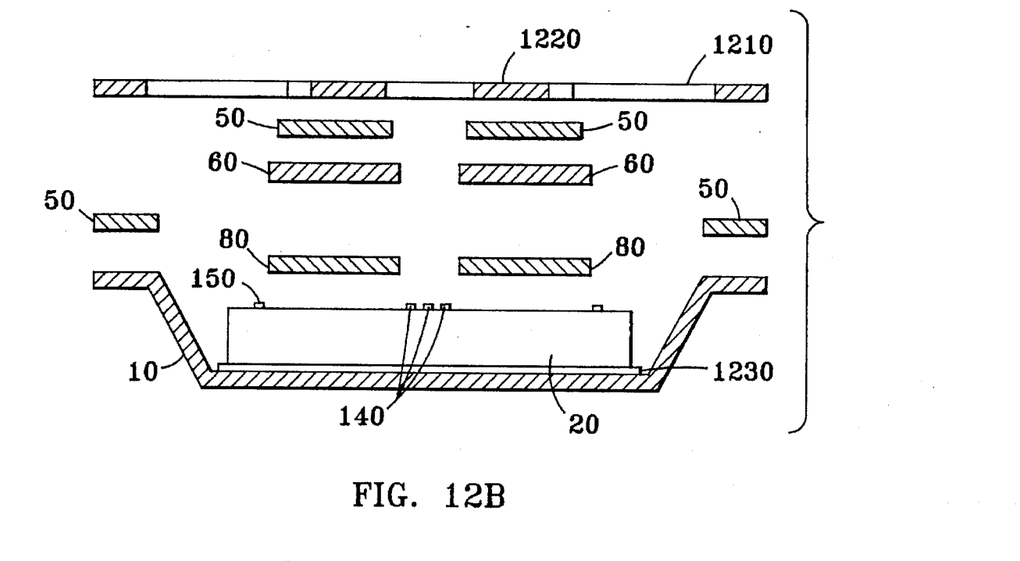

FIGS. 12A and 12B show a seventh embodiment of the tape application platform which combines the tape application platform with a lead frame into an assembly (hereinafter called a lead paddle assembly), having unique advantages of its own. The lead paddle assembly of FIGS. 12A and 12B is conceptually a combination of two tape application platforms facing each other. FIG. 12A is a top view; FIG. 12B is an exploded cross-section view. In FIG. 12A and 12B, lead frame 1210 is not laminated to the surface of IC chip 20. IC chip 20 is back-bonded to a "down-set" base 10, using for example a conventional low-melting eutectic alloy or epoxy die-bond adhesive 1230. Or alternatively, 1230 can be a double-sided tape. Double-sided tape pieces 50 adhere to both base 10 and lead frame 1210. Single-sided lower tape pieces 80 have adhesive only on their top surfaces and adhere only to bottom surfaces of bus elements 60, insulating bus elements 60 from IC chip 20. Single or double-sided upper tape pieces 80 insulate bus elements 60 from lead fingers 1220 of lead frame 1210, and from wire bonds (not shown) which connect bond pads 140 and/or 150 of IC chip 20 to wire-bondable areas on fingers 1220 of lead frame 1210. Wire bonds may also connect lead fingers 1220 to bus elements 60. This embodiment provides a relatively rigid lead paddle assembly with lead-frame fingers held firmly in position for work holder clamping and for wire bonding. The symmetric disposition of lead frame material distributes mechanical stress advantageously. Bus elements 60 can extend the full length of IC chip 20, providing full-length continuous bonding areas for ground, shield, or power connections. Bus elements 60 along with the upper tape pieces 50 of FIG. 12B may be omitted in some applications, in which case single-sided tape 80 may adhere to lead fingers 1220, insulating them from IC chip 20.

A process using the embodiment shown in FIGS. 12A and 12B involves applying tapes 1230 and 50 to base 10, aligning IC chip 20 and placing it against tape 1230, to form a platform base assembly. Tapes 50 and 80 are applied to bus elements 60 (if used) to form a optional bus dement assembly. This bus element assembly is aligned and applied to lead fingers 1220. Lead fingers 1220 are aligned to IC chip 20 on the platform base assembly, attaching lead fingers 1220 to the platform base assembly by pressing against double-sided adhesive tape 50. If tapes 50 and/or 80 require curing, they are cured. Then wire bond interconnections (not shown in FIGS. 12A and 12B) are made between bonding pads 140 and/or 150 of IC chip 20 and lead fingers 1220. Optionally bonding interconnections may be made between bus elements 60 and pads 140 and/or 150 of IC chip 20, and/or lead fingers 1220. Encapsulating IC chip 20 and surrounding parts of the lead paddle assembly, typically with an encapsulant such as epoxy (not shown) completes the process.

While the present invention has been described with reference to a few specific embodiments, the description is illustrative of the invention and is not to be construed as limiting the invention. Various substitutions, additions and modifications may become apparent to those skilled in the art without departing from the true spirit and scope of the invention as defined by the appended claims. For example, the order in which process steps are performed may be varied, and sub-assemblies may be assembled in separate operations. Many equivalent materials may be substituted for the particular materials mentioned in the descriptions of the few embodiments illustrated. For example flexible circuit materials such as metallized polyimide or Mylar films may be substituted for base 10 and/or for printed circuit cards or boards to which the IC chip is bonded.

Having described our invention, we claim:

1. A tape application platform for holding and interconnecting at least one integrated circuit chip to circuitry, comprising:
   a) a base having first and second base sides, having at least one slot communicating with both said first and second base sides, said base having at least one electrically-conductive surface on at least one of said first and second base sides, said electrically-conductive surface including a surface layer having resistivity greater than 10 ohm-centimeters;
   b) tape having first and second tape sides, and having adhesive on at least one of said first and second tape sides adherent to at least one of said chip and said base; and
   c) at least one wire passing through said slot and bonded to said integrated circuit chip, providing interconnection of said integrated circuit chip to said circuitry.

2. A tape application platform as in claim 1, wherein said surface layer comprises two or more metal layers combined in proportions such that their composite thermal expansion coefficient is between 5 parts per million per degree Celsius and 15 parts per million per degree Celsius.

3. A tape application platform as in claim 1, wherein said electrically-conductive surface comprises a surface layer having resistivity greater than 75 ohm-centimeters.

4. A tape application platform as in claim 1, wherein said electrically-conductive surface has sheet resistivity less than 10,000 ohms/square.

5. A tape application platform as in claim 1, wherein said electrically-conductive surface has sheet resistivity between about 10,000 ohms/square and 100,000 ohms/square.

6. A tape application platform as in claim 1, wherein said electrically-conductive surface has sheet resistivity between about 15,000 ohms/square and 50,000 ohms/square.

7. A tape application platform as in claim 1, wherein said electrically-conductive surface comprises a layer of thickness between 0.003 millimeters and 0.3 millimeters.

8. A tape application platform as in claim 1, wherein said electrically-conductive surface comprises a layer of thickness between 0.015 millimeters and 0.065 millimeters.

9. A tape application platform as in claim 1, wherein said surface layer comprises a first copper layer, an Invar layer, and a second copper layer, said first copper layer comprises 1% to 25%, said Invar layer comprises 50% to 98%, and said second copper layer comprises 1% to 25% of said surface layer.

10. A tape application platform as in claim 9, wherein said first copper layer comprises 5% to 12.5%, said Invar layer comprises 75% to 90%, and said second copper layer comprises 5% to 12.5% of said surface layer.

11. A tape application platform as in claim 1, wherein said base has a thickness between 0.25 millimeters and 1.5 millimeters.

12. An integrated circuit lead paddle assembly for holding and handling an integrated circuit chip, said integrated circuit chip having edges, a back side, and an active side with bonding pads, comprising:
   a) a tape application platform as in claim 1, to which said back side of said integrated circuit chip may be attached, the plane of attachment defining a reference plane, and portions of said tape application platform being deformed out of said reference plane,
   b) a multiplicity of lead fingers aligned with said integrated circuit chip adjacent to said bonding pads,
   c) a second tape disposed to attach said multiplicity of lead fingers to said tape application platform at said portions deformed from said reference plane,
   d) a third tape adhering to said lead fingers but not adhering to said chip, disposed to insulate said active side of said chip from said lead fingers,
thereby allowing wire bonds for connecting selected pads of said bonding pads with selected fingers of said multiplicity of lead fingers.

13. An integrated circuit lead paddle assembly as in claim 12, further comprising:
   e) one or more conductive elements disposed between said lead fingers and said active side of said integrated circuit chip, and having at least a portion of each said conductive element exposed, and
   f) a tape adhering to each conductive element, but not adhering to said integrated circuit chip, thereby insulating each said conductive element from said integrated circuit chip,
thereby providing said exposed portions for wire bonding to selected pads of said bonding pads of said integrated circuit chip and to selected fingers of said multiplicity of lead fingers.

* * * * *